US006236668B1

(12) United States Patent
Osada et al.

(10) Patent No.: US 6,236,668 B1
(45) Date of Patent: May 22, 2001

(54) SEMICONDUCTOR LASER APPARATUS AND PUMPING CIRCUIT THEREFOR

(75) Inventors: Shinichi Osada; Tomozo Yamanouchi, both of Shiga (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/315,586

(22) Filed: May 20, 1999

(30) Foreign Application Priority Data

Jun. 29, 1998 (JP) .................................................. 10-181952

(51) Int. Cl.[7] ........................................................ H01S 3/04
(52) U.S. Cl. ................... 372/34; 372/38; 372/36; 372/69
(58) Field of Search .................................... 372/34, 36, 38, 372/69, 87; 361/106; 338/22; 219/121.6

(56) References Cited

U.S. PATENT DOCUMENTS

| 4,243,952 | * | 1/1981 | Patterson | 331/94.5 S |
|---|---|---|---|---|
| 5,740,195 | * | 4/1998 | Murray et al. | 372/87 |
| 5,796,568 | * | 8/1998 | Baiatu | 361/106 |
| 5,999,551 | * | 12/1999 | Yoshizawa | 372/38 |
| 6,023,053 | * | 2/2000 | Nakayama et al. | 219/121.6 |
| 6,094,129 | * | 7/2000 | Baiatu | 338/22 |

FOREIGN PATENT DOCUMENTS

| 59-017291 | 1/1984 | (JP) . |
|---|---|---|
| 3-145171 | 6/1991 | (JP) . |
| 8-255704 | 10/1996 | (JP) . |
| 8-316560 | 11/1996 | (JP) . |

* cited by examiner

Primary Examiner—Leon Scott, Jr.
(74) Attorney, Agent, or Firm—Coudert Brothers

(57) ABSTRACT

A pumping circuit for a semiconductor laser is formed by connecting a semiconductor laser in series with a positive temperature coefficient (PTC) thermistor element which has a temperature coefficient in the range between $-1.5\%/°$ C. and $-0.5\%/°$ C. within the temperature range between $-20°$ C. and $+70°$ C. and of which the temperature coefficient becomes positive at a temperature over $+70°$ C. A resistor insensitive to temperature changes may be further connected to the PTC thermistor element either in series or in parallel. The semiconductor laser and the PTC thermistor element are disposed sufficiently close to each other so as to be thermally coupled inside a container such as a can to form a semiconductor apparatus.

18 Claims, 3 Drawing Sheets

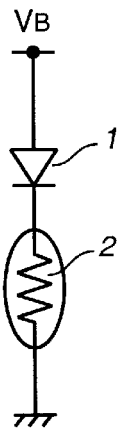
FIG._1
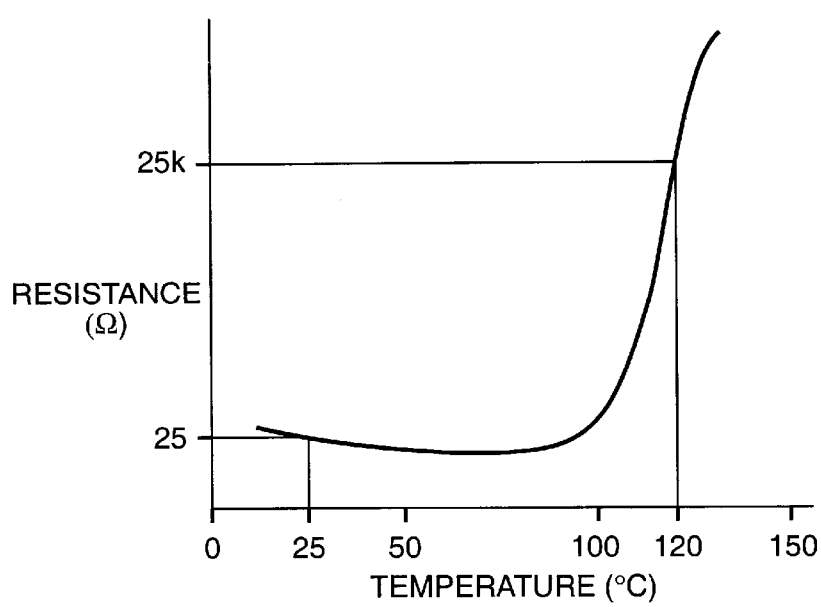
FIG._3
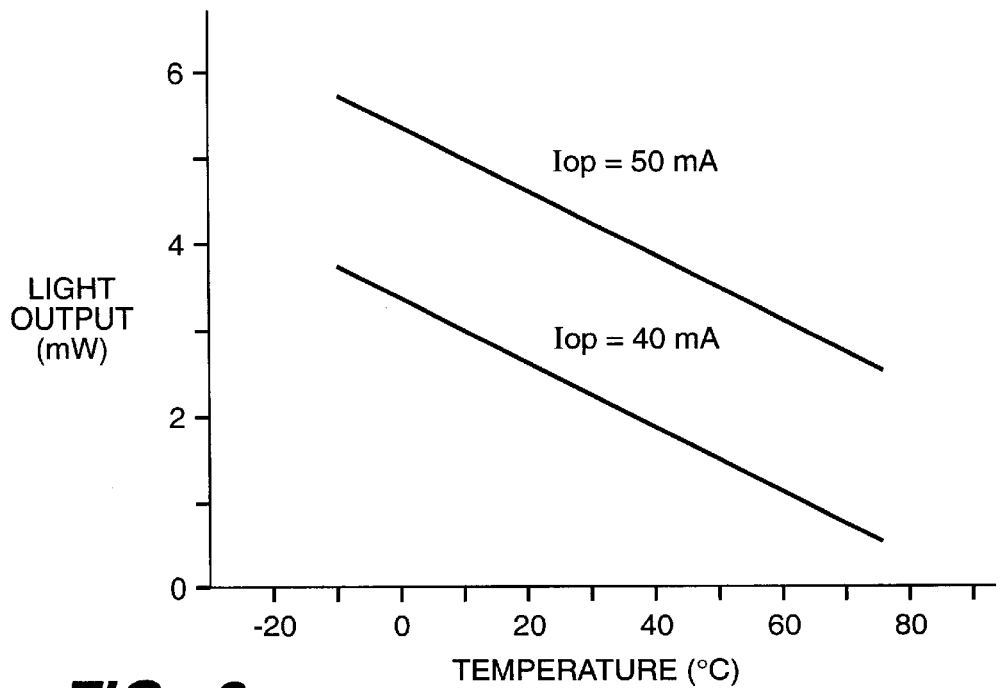
FIG._2

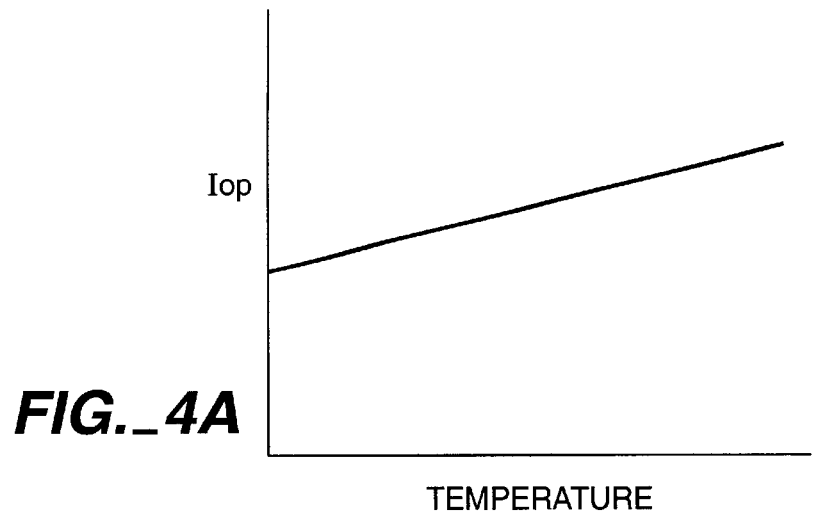
FIG._4A
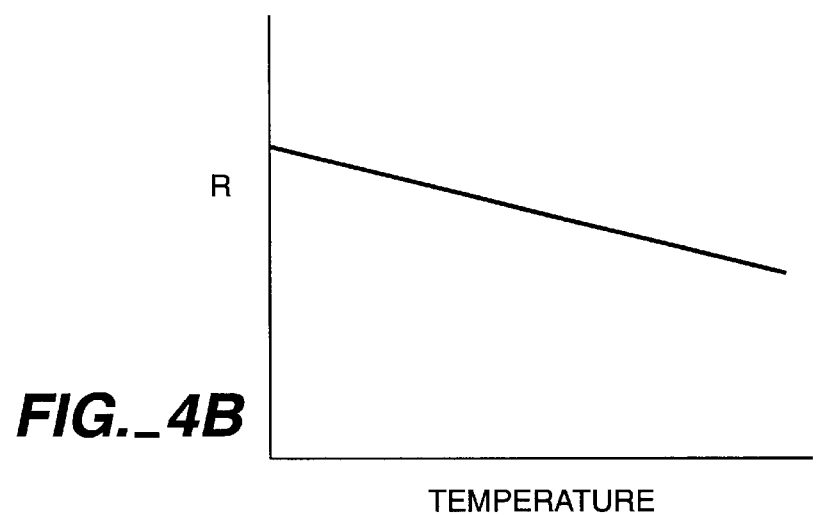
FIG._4B
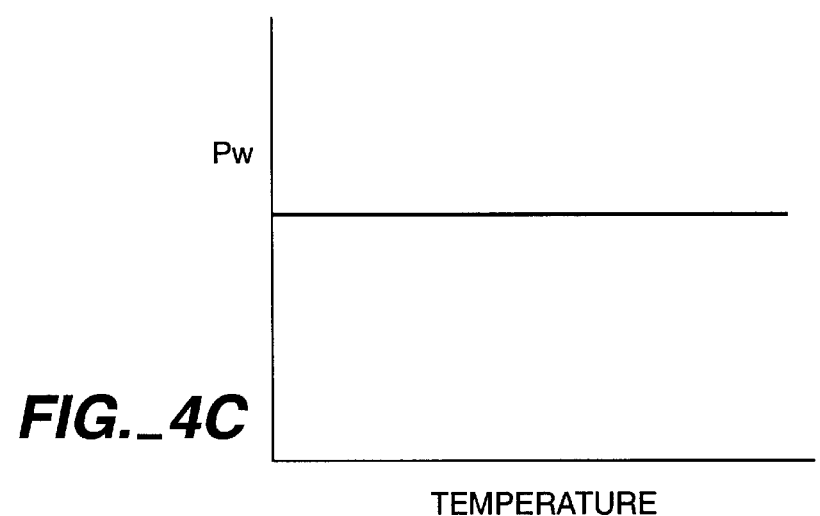
FIG._4C

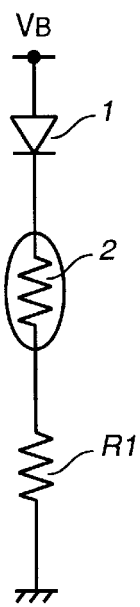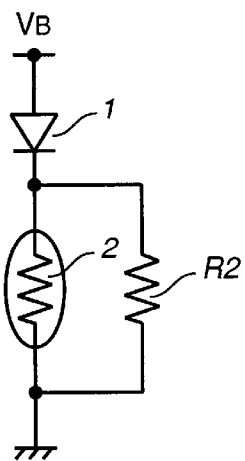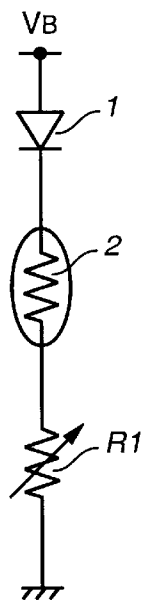
FIG._5A            FIG._5B            FIG._5C
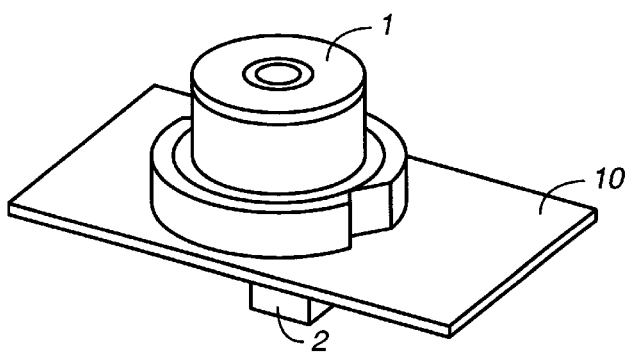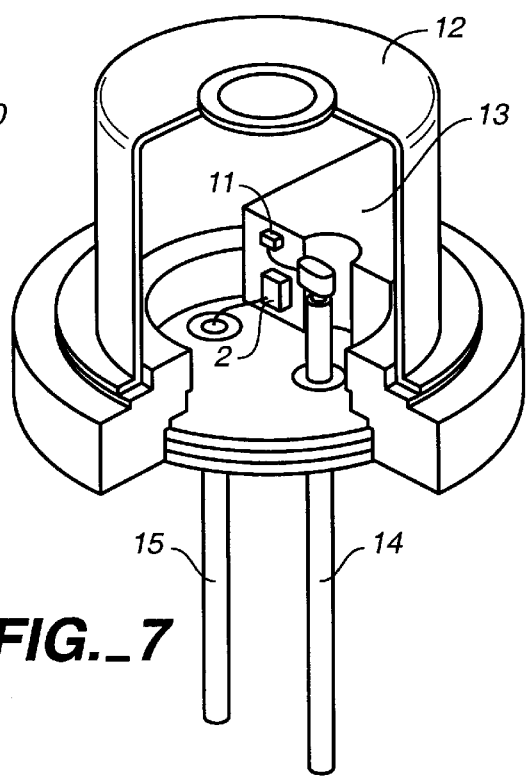
FIG._6A
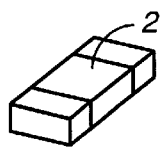
FIG._6B            FIG._7

SEMICONDUCTOR LASER APPARATUS AND PUMPING CIRCUIT THEREFOR

BACKGROUND OF THE INVENTION

This invention relates to a semiconductor laser apparatus and a pumping circuit therefor capable of providing a stable light output therefrom.

The light output from a semiconductor laser apparatus usually fluctuates because the threshold current intensity for laser excitation depends on temperature. It has therefore been known to make use of a so-called automatic power control (APC) circuit in order to obtain a stable light output without regard to changes in temperature. Such an APC circuit may comprise a photodetector and serve to detect a portion of the light output from a semiconductor laser apparatus with the photodetector and to automatically adjust the pump current for the semiconductor laser according to the level of output from the photodetector. This method, however, has several disadvantages. Firstly, it is difficult to obtain a stable light output from the moment immediately after the pumping of the semiconductor laser is started because the stabilization of the light output is obtained by a feedback circuit and there are delay elements due to the time constant of the feedback loop. The method may be suited for the CW operation but in the case of pulse pumping, the on-off control of the semiconductor laser may be carried out, for example, by integrating the output pulse signals from the photodetector and detecting changes in the integrated output. Thus, the control circuit inclusive of the photodetector will have a complicated structure as a whole. Secondly, an excessively large current may flow into the semiconductor if there is an abnormality in any of the elements of the feedback loop but there is no adequate means to protect the semiconductor laser therefrom. Thirdly, the circuit structure as a whole becomes complicated. Not only does this adversely affect the cost, but it will also be difficult to miniaturize the apparatus.

In view of the first of the problems described above, Japanese Patent Publications Tokkai 59-17291 and Tokkai 8-316560 disclosed circuits adapted to carry out temperature compensation by means of an open loop and to thereby avoid a time delay associated with the detection of light and the feedback circuit. In view of the second of the problems, Japanese Patent Publication Tokkai 3-145171 disclosed a protective circuit which detects the pump current of the semiconductor laser by means of a current-detecting resistor and switches off the transistor which controls the current to the semiconductor laser when the detected value increases past a specified level. The circuit disclosed in Tokkai 8-316560, however, includes a large number of components such as differential amplifiers, control transistors, resistors of all kinds, diodes and thermistors and hence cannot overcome the third of the problems described above. Neither is the protective circuit disclosed in Tokkai 3-145171 capable of solving the third problem described above because it must be used together with a circuit forming a feedback loop by using a prior art photodetector. As for the circuit disclosed in Tokkai 59-17291, it has no protective means against abnormal heating of the semiconductor laser due to a rise in the environmental temperature or an overcurrent.

SUMMARY OF THE INVENTION

It is therefore an object of this invention to provide a pumping circuit for a semiconductor laser capable of suppressing variations in the light output due to temperature changes and eliminating at the same time the problems of overheating of the semiconductor laser without making the circuit structure overly complicated or increasing the size of the apparatus.

It is another object of this invention to provide a semiconductor laser apparatus incorporating such a pumping circuit.

A pumping circuit for a semiconductor laser embodying this invention, with which the above and other objects can be accomplished, may be characterized as having a positive temperature coefficient (PTC) thermistor element with temperature coefficient in the range between −1.5%/° C. and −0.5%/° C. within the temperature range between −20° C. and +70° C. and the temperature coefficient becoming positive at a temperature over +70° C. connected in series in a current route to the semiconductor laser.

The ratio of temperature change to change in light output for small and medium sized semiconductor lasers of less than 100 mW is usually −1%/° C. within the range of temperatures under normal use between −20° C. and +70° C. Thus, the temperature coefficient of a PTC thermistor as described above is sufficient to cancel the change in light output from such a semiconductor laser due to temperature changes and hence the light output under normal temperatures during operation can be stabilized. When the environmental temperature becomes higher than the normal operating temperature, a prior art APC circuit of the kind discussed above will tend to increase the current passing to the semiconductor laser, but the PTC thermistor described above will change its temperature coefficient to a positive value at a temperature higher than 70° C. and its resistance increases further as temperature increases more. Thus, abnormal heating of a semiconductor apparatus due to an excessively strong current can be prevented according to this invention.

The temperature coefficient of a PTC thermistor in the temperature range between −20° C. and +70° C. can be made approximately equal to the temperature coefficient of light output from an ordinary semiconductor laser within the same temperature range but when the characteristic of change in resistance against change in temperature is set, the resistor may be connected either in series or in parallel with the PTC thermistor element.

If the current passing to the semiconductor laser becomes excessively large for whatever reason such as an abnormal rise in the source voltage, the semiconductor laser may be destroyed by a large current. If a PTC thermistor element is set near the semiconductor laser so as to be thermally coupled with it, the temperature coefficient of the PTC thermistor element becomes positive at a specified temperature above 70° C. and becomes higher in the higher temperature region, thereby rapidly suppressing the current passing to the semiconductor laser and controlling the generation of heat therefrom. Destruction of the expensive semiconductor laser can thus be averted.

A semiconductor laser apparatus embodying this invention may be characterized wherein the semiconductor laser forming the semiconductor laser circuit described above and one PTC thermistor together form one semiconductor laser apparatus. In other words, a complete circuit is formed only with passive elements, unlike the prior art APC circuits or protective circuits, such that compact apparatus can be obtained as semiconductor laser with a PTC thermistor element.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1 is a circuit diagram of a semiconductor laser pumping circuit according to a first embodiment of this invention;

FIG. 2 is a graph showing the light output-temperature characteristic of a semiconductor laser;

FIG. 3 is a graph showing the resistance-temperature characteristic of a PTC thermistor element;

FIGS. 4A, 4B and 4C are graphs respectively for showing the temperature characteristic of the pump current for stabilizing the light output of the semiconductor laser, the temperature characteristic of the resistance of the PTC thermistor in a lower-temperature region and the light output characteristic of the semiconductor laser after the temperature compensation;

FIGS. 5A, 5B and 5C are circuit diagrams of other semiconductor laser pumping circuits embodying this invention;

FIG. 6A is a diagonal external view of a semiconductor laser apparatus embodying this invention, and FIG. 6B is a diagonal external view of a PTC thermistor element incorporated therein; and FIG. 7 is a partially cut out diagonal external view of another semiconductor laser apparatus according to this invention.

Throughout herein, like or equivalent components are indicated by the same numerals even where they are components of different apparatus and may not necessarily be described repetitiously.

DETAILED DESCRIPTION OF THE INVENTION

The invention is described next by way of a first embodiment with reference to FIGS. 1–4. FIG. 1 is a circuit diagram of a semiconductor laser pumping circuit including a semiconductor laser 1. A PTC thermistor element 2 is connected in series to the semiconductor laser 1, and a source voltage $V_B$ is applied to this series connection. The source voltage $V_B$ may be 3.0 V according to a popular usage. The semiconductor laser 1 may be a 3 mW infrared semiconductor laser usable for CD and DVD optical pick-up. The voltage drop $V_{op}$ across this semiconductor laser 1 is usually about 2.0 V. If the level of the pump current $I_{op}$ at which the semiconductor laser 1 can operate stably is 40 mA, a PTC thermistor element with resistance at temperature 25° C. $R_{25}=(3.0-2.0)/0.04=25\Omega$ will be used.

FIG. 2 shows the light output-temperature characteristic of a semiconductor laser when the pump current $I_{op}$ is constant. As can be seen, the light output changes at a rate of about $-1\%/°$ C. with respect to temperature. This means that the pump current $I_{op}$ must be increased or decreased at a rate of about $+1\%/°$ C. according to the environmental temperature in order to obtain a stable light output. In other words, if the source voltage $V_B$ remains constant, the PTC thermistor element is required to have a resistance-temperature characteristic of about $-1\%/°$ C.

FIG. 3 shows the resistance-temperature characteristic of a PTC thermistor element. If the PTC thermistor element is made of a ceramic or inorganic material, its characteristic is between about $-0.5\%/°$ C. and $-1.5\%/°$ C. in a lower-temperature region below the point at which its resistance increases suddenly. This characteristic can be adjusted by varying the fabrication conditions such as the composition of the constituent material and the conditions of the firing process. Thus, use is made of a PTC thermistor element of which the temperature characteristic below the temperature of sudden rise in resistance is similar to the inverse of the temperature characteristic of the semiconductor laser. If such a PTC thermistor element is used and connected in series with the semiconductor laser 1 as shown in FIG. 1, a pumping circuit with a very stable light output can be obtained.

FIGS. 4A, 4B and 4C show this relationship more in detail, FIG. 4A showing the changes in the pump current $I_{op}$ against temperature in order to stabilize the light output of the semiconductor laser and FIG. 4B showing the resistance-temperature characteristic of the PTC thermistor element in the lower-temperature region below the point at which a sudden rise in resistance occurs. If the pump current $I_{op}$ changes at the rate of $+1\%/°$ C. corresponding to the temperature change in order to stabilize the light output and if the temperature characteristic of the resistance of the PTC thermistor is $-1\%/°$ C., the light output $P_w$ of the semiconductor laser becomes stable against temperature changes, as shown in FIG. 4C.

If the pump current $I_{op}$ to the semiconductor laser increases for some reason such as a rise in the source voltage $V_B$, the temperature of the semiconductor laser will increase. If the PTC thermistor element is disposed sufficiently close so as to thermally couple with the semiconductor laser, the resistance of the PTC thermistor rises to 25 k$\Omega$ when the temperature of the semiconductor laser rises to 120° C. according to FIG. 3. This will keep the pump current of the semiconductor laser at 1V/25 k$\Omega$=40 $\mu$A, and the heat generation by the semiconductor laser is reliably inhibited. The resistance of the PTC thermistor rises also when the environmental temperature increases such that the pump current for the semiconductor laser is controlled and the destruction of the semiconductor laser due to high temperature can be prevented.

FIGS. 5A, 5B and 5C show circuit structures of other semiconductor laser pumping circuits. FIG. 5A shows an example wherein both a PTC thermistor element 2 and a resistor R1 are connected in series with a semiconductor laser 1. FIG. 5B shows another example wherein a parallel connection of a PTC thermistor 2 and a resistor R2 is connected in series with a semiconductor laser 1. By thus forming a series or parallel connection of a PTC thermistor element and an ordinary resistor of which the resistance is practically independent of temperature, the temperature dependence of the overall combination can be controlled. In the example shown in FIG. 5A, the resistor R1 connected in series effectively increases the resistance of the circuit, and the slope of the resistance-temperature characteristic curve becomes less steep. In the example shown in FIG. 5B, the resistor R2 connected in parallel effectively reduces the resistance of the overall circuit, and slope of the resistance-temperature characteristic curve again becomes less steep. FIG. 5C shows still another example wherein a variable resistor R3 is connected in series with a PTC thermistor element 2. The resistance of the variable resistor R3 may be set equal to about ⅕ to ¹⁄₁₀ of the resistance $R_{25}$ at 25° C. of the PTC thermistor 2 such that the initial condition can be adjusted by varying its resistance. If $V_B$=3.0V and the voltage drop $V_{op}$ across the semiconductor laser 1 is 2.0V, for example, a pump current $I_{op}$ of 40 $\mu$m can be obtained at room temperature of 25° C. by adjusting such that the total resistance of the PTC thermistor 2 and the variable resistor R3 will remain at 25$\Omega$ because (3.0–2.0)/0.04=25$\Omega$.

FIGS. 6A and 6B show a semiconductor apparatus embodying this invention. A semiconductor laser 1 as described above is mounted onto the upper surface of a printed substrate 10, and a PTC thermistor 2 therefor is mounted to the lower surface of the substrate 10 approximately opposite to the semiconductor laser 1 so as to be thermally coupled with the semiconductor laser 1 across the substrate 10 and hence to change its resistance as heated by the heat from the semiconductor laser 1.

FIG. 7 shows another semiconductor apparatus embodying this invention having a semiconductor laser element 11 mounted onto a heat sink 13 inside a can 12 (also referred to as the "container" below). A PTC thermistor element 2 in the shape of a pellet is also mounted to the same heat sink 13. A lead terminal 14 is connected to the semiconductor laser element 11 by wire bonding, and another lead terminal 15 is attached to the PTC thermistor element 2 also by wire bonding. In other words, the PTC thermistor element 2 is sealed inside the can 12 when the semiconductor laser apparatus is assembled such that an improved semiconductor laser apparatus capable of carrying out both temperature compensation and protection against overcurrent situations can be obtained without increasing the external dimensions of the apparatus.

According to this invention, temperature compensation is effected through an open loop control. Thus, there is no problem of response delay in stabilizing the light output of a semiconductor laser in the temperature range of normal use between −20° C. and +70° C. Since the scale of the circuit is not increased, miniaturization is possible, allowing compact apparatus to be made in an economically advantageous way.

What is claimed is:

1. A semiconductor laser pumping circuit comprising a semiconductor laser and a positive temperature coefficient PTC thermistor element connected in series, said PTC thermistor element having temperature coefficient between −0.5%/° C. and −1.5%/° C. at temperatures between −20° C. and +70° C. and said temperature coefficient becoming positive at a temperature over +70° C.

2. The semiconductor laser pumping circuit of claim 1 further comprising a resistor which is connected in series with said PTC thermistor element.

3. The semiconductor laser pumping circuit of claim 2 wherein said PTC thermistor element is disposed sufficiently close to said semiconductor laser so as to be thermally coupled with said semiconductor laser.

4. The semiconductor laser pumping circuit of claim 1 further comprising a resistor which is connected in parallel with said PTC thermistor element.

5. The semiconductor laser pumping circuit of claim 3 wherein said PTC thermistor element is disposed sufficiently close to said semiconductor laser so as to be thermally coupled with said semiconductor laser.

6. The semiconductor laser pumping circuit of claim 1 wherein said PTC thermistor element is disposed sufficiently close to said semiconductor laser so as to be thermally coupled with said semiconductor laser.

7. A semiconductor laser apparatus comprising:

a semiconductor laser;

a positive temperature coefficient PTC thermistor element connected in series with said semiconductor laser, said PTC thermistor element having temperature coefficient between −0.5%/° C. and −1.5%/° C. at temperatures between −20° C. and +70° C. and said temperature coefficient becoming positive at a temperature over +70° C.; and a container which encapsulates both said semiconductor laser and said PTC thermistor element inside.

8. The semiconductor laser apparatus of claim 7 further comprising a resistor which is connected in series with said PTC thermistor element.

9. The semiconductor laser apparatus of claim 8 wherein said PTC thermistor element is disposed sufficiently close to said semiconductor laser so as to be thermally coupled with said semiconductor laser.

10. The semiconductor laser apparatus of claim 9 further comprising a heat sink, both said PTC thermistor element and said semiconductor laser being disposed on said heat sink.

11. The semiconductor laser apparatus of claim 9 further comprising a substrate, said PTC thermistor element and said semiconductor laser being mounted to said substrate on opposite surfaces thereof.

12. The semiconductor laser apparatus of claim 7 further comprising a resistor which is connected in parallel with said PTC thermistor element.

13. The semiconductor laser apparatus of claim 12 wherein said PTC thermistor element is disposed sufficiently close to said semiconductor laser so as to be thermally coupled with said semiconductor laser.

14. The semiconductor laser apparatus of claim 13 further comprising a heat sink, both said PTC thermistor element and said semiconductor laser being disposed on said heat sink.

15. The semiconductor laser apparatus of claim 13 further comprising a substrate, said PTC thermistor element and said semiconductor laser being mounted to said substrate on opposite surfaces thereof.

16. The semiconductor laser apparatus of claim 7 wherein said PTC thermistor element is disposed sufficiently close to said semiconductor laser so as to be thermally coupled with said semiconductor laser.

17. The semiconductor laser apparatus of claim 16 further comprising a heat sink, both said PTC thermistor element and said semiconductor laser being disposed on said heat sink.

18. The semiconductor laser apparatus of claim 16 further comprising a substrate, said PTC thermistor element and said semiconductor laser being mounted to said substrate on opposite surfaces thereof.

* * * * *